United States Patent [19]
Havel

[11] Patent Number: 6,121,944
[45] Date of Patent: *Sep. 19, 2000

[54] METHOD OF INDICATING AND EVALUATING MEASURED VALUE

[75] Inventor: Karel Havel, Bramalea, Canada

[73] Assignee: Texas Digital Systems, Inc.

[ * ] Notice: This patent is subject to a terminal disclaimer.

[21] Appl. No.: 09/093,261

[22] Filed: Jun. 8, 1998

Related U.S. Application Data

[62] Division of application No. 08/721,719, Sep. 27, 1996, Pat. No. 5,963,185, which is a division of application No. 08/422,090, Mar. 31, 1995, Pat. No. 5,561,365, which is a division of application No. 08/099,411, Jul. 30, 1993, abandoned, which is a division of application No. 07/767,792, Sep. 30, 1991, abandoned, which is a division of application No. 07/528,229, May 24, 1990, Pat. No. 5,057,768, which is a division of application No. 07/337,410, Apr. 13, 1989, abandoned, which is a division of application No. 06/940,100, Dec. 10, 1986, Pat. No. 4,831,326, which is a continuation-in-part of application No. 06/882,430, Jul. 7, 1986, Pat. No. 4,734,619.

[51] Int. Cl.[7] ..................................................... G09G 3/32
[52] U.S. Cl. ................................................ 345/83; 345/46
[58] Field of Search ..................................... 345/83, 82, 34, 345/39, 114, 33, 35, 44, 46

[56] References Cited

U.S. PATENT DOCUMENTS

| | | | |
|---|---|---|---|
| 2,643,344 | 6/1953 | McLaren et al. | 250/83.6 |
| 2,648,015 | 8/1953 | Greenfield et al. | 250/83.6 |

(List continued on next page.)

FOREIGN PATENT DOCUMENTS

| | | |
|---|---|---|
| 220844A | 4/1985 | German Dem. Rep. . |
| 3037-500 | 4/1981 | Germany . |
| 3009416 | 9/1981 | Germany . |
| 57-146112 | 9/1982 | Japan . |
| 2158631A | 11/1985 | United Kingdom . |

OTHER PUBLICATIONS

Wagner, B., "2–Color LED + Driver=Versatile Visual Effects", EDN vol. 25, No. 19, Oct. 20, 1980.

Smithline, L.M., "Dual light emitting diode synthesizes polychromatic light", Electronics, Aug. 16, 1979, p. 130.

Svestka, M. et al, "LED's change color to indicate balance voltage", Electronic Engineering, vol. 48, No. 576, p. 19, Feb. 1976.

Saitoh, T. et al. "Multi–color light emitting diodes with double junction structure". IEEE Transactions on Electron Devices, Feb. 1975, vol. ED–22, No. 2, pp. 29–32.

(List continued on next page.)

*Primary Examiner*—Regina Liang
*Attorney, Agent, or Firm*—Winstead Sechrest & Minick

[57] ABSTRACT

A method of measuring, indicating, and automatically evaluating a measured value comprises the steps of measuring a signal, exhibiting a digital indication of the measured value of the signal on a multicolor light emitting diode display device that is substantially surrounded by a variable color background area, comparing the measured value with a limit to determine their relation, and controlling color of the background area accordingly, to simultaneously indicate the measured value of the signal, by the digital indication, and its significance, by color of the background area.

12 Claims, 6 Drawing Sheets

U.S. PATENT DOCUMENTS

| | | | |
|---|---|---|---|
| 2,682,000 | 6/1954 | Clayton et al. | 250/83.6 |
| 2,878,450 | 3/1959 | Rabier . | |
| 2,889,518 | 6/1959 | Hudson et al. | 324/115 |
| 3,595,991 | 7/1971 | Diller | 178/5.4 |
| 3,719,849 | 3/1973 | Steward . | |
| 3,740,570 | 6/1973 | Kaelin et al. . | |
| 3,760,174 | 9/1973 | Boenning et al. | 240/1 R |
| 3,771,155 | 11/1973 | Hayashi et al. . | |
| 3,840,873 | 10/1974 | Usui . | |
| 3,873,979 | 3/1975 | Craford et al. . | |
| 3,911,418 | 10/1975 | Takeda | 340/324 |
| 3,924,227 | 12/1975 | Stolov . | |
| 3,975,726 | 8/1976 | Kawakami . | |
| 4,086,514 | 4/1978 | Havel | 313/500 |
| 4,271,408 | 6/1981 | Teshima et al. | 340/702 |
| 4,301,450 | 11/1981 | Smoliar | 340/175 |
| 4,360,804 | 11/1982 | Ohura . | |
| 4,488,149 | 12/1984 | Givens, Jr. | 340/762 |
| 4,559,480 | 12/1985 | Nobs | 315/324 |
| 4,581,612 | 4/1986 | Jones | 340/791 |
| 4,647,217 | 3/1987 | Havel . | |
| 4,689,613 | 8/1987 | Ikeda . | |
| 4,709,230 | 11/1987 | Popowski et al. . | |
| 4,712,099 | 12/1987 | Maeda . | |
| 4,720,709 | 1/1988 | Imamura et al. . | |
| 4,725,828 | 2/1988 | Cowlishaw . | |
| 4,740,818 | 4/1988 | Tsilibes et al. | 355/14 R |
| 4,771,274 | 9/1988 | Havel . | |
| 4,831,326 | 5/1989 | Havel . | |
| 5,003,298 | 3/1991 | Havel . | |
| 5,057,768 | 10/1991 | Havel . | |

OTHER PUBLICATIONS

Yamaguchi, T. et al, "a High Brightness Gap Multicolor LED", IEEE Transactions on Electron Devices, vol. ED–28, No. 5, May 1981, pp. 588–592.

Baker, M., "Chip changes the color of light emitting diodes", Electronics, Apr. 7, 1981, pp. 158–159.

Rao, V., Two LED's blend and blink to indicate six states. Electronic Design, vol. 30, No.16, p. 220, Aug. 5, 1982.

Kojima, T. "Recent flat panel development in Japan", held in San Diego, CA, Apr. 29—May 1, 1980. SID 80 Digest, pp. 22–23.

Niina, T. et al, "A multi–color GaP LED flat panel display device" Held New York, NY, USA, Apr. 28–30, 1981. 1981 SID International Symposium Digest of Papers, vol. XII (1981), pp. 140–141.

Niina, T. et al, "A multi–color LED flat panel display device for colorful displays of letters and figures". Proceedings of the SID, vol. 23, No. 2, pp. 73–76, 1982.

O'Mara, P.A. et al, "Microprocessor–controlled light emitting diode dark adaptometer". Medical & Biological Engineering and Computing, vol. 20, No. 1, pp. 70–76, 1982.

Landauer, R. W., "Electroluminescent Display", IBM Technical Disclosure Bulletin, vol. 8, No. 11, pp. 15–16, Apr. 11, 1966.

SenSym Solid State Barometers Catalog, pp. 9–30, 1983.

METHOD OF INDICATING AND EVALUATING MEASURED VALUE

CROSS-REFERENCE TO RELATED APPLICATIONS

This is a division of my application Ser. No. 08/721,719, filed on Sep. 27, 1996, entitled Display Device with Variable Color Background Area now U.S. Pat. No. 5,963,185, which is a division of my application Ser. No. 08/422,090, filed on Mar. 31, 1995, entitled Digital Color Display System, now U.S. Pat. No. 5,561,365 issued on Oct. 1, 1996, which is a division of my application Ser. No. 08/099,411, filed on Jul. 30, 1993, entitled Method of Measuring and Indicating, now abandoned, which is a division of my application Ser. No. 07/767,792, filed on Sep. 30, 1991, entitled Method of Measuring and Indicating, now abandoned, which is a division of my application Ser. No. 07/528,229, filed on May 24, 1990, entitled Measuring Device with Variable Color Display, now U.S. Pat. No. 5,057,768 issued on Oct. 15, 1991, which is a division of my application Ser. No. 07/337,410, filed on Apr. 13, 1989, entitled Digital Voltmeter with Variable Color Background, now abandoned, which is a division of my application Ser. No. 06/940,100, filed on Dec. 10, 1986, entitled Digital Voltmeter with Variable Color Background, now U.S. Pat. No. 4,831,326 issued on May 16, 1989, which is a continuation-in-part of my application Ser. No. 06/882,430, filed on Jul. 7, 1986, entitled Display Device with Variable Color Background, now U.S. Pat. No. 4,734,619 issued on Mar. 29, 1988.

This also relates to my application Ser. No. 06/922,847, filed on Oct. 24, 1986, entitled continuously Variable Color Display Device, now U.S. Pat. No. 4,845,481 issued on Jul. 4, 1989, to my application Ser. No. 07/322,341, filed on Mar. 13, 1989, entitled Continuously Variable Color Optical Device, now U.S. Pat. No. 4,965,561 issued on Oct. 23, 1990, and to my application Ser. No. 06/929,625, filed on Nov. 12, 1986, entitled Variable Color Digital Display Device, now U.S. Pat. No. 4,771,274 issued on Sep. 13, 1988.

BACKGROUND OF THE INVENTION

1. Field of the Invention

This invention relates to measuring devices utilizing a variable color display.

2. Description of the Prior Art

Commercially available measuring instruments with monochromatic digital readout are capable of performing measurements and displaying results at a relatively fast rate. However, to determine a significance of each measured value, an operator must rapidly read displayed values and perform mental comparisons with predetermined limits. The task is much more complicated when the limits are variable.

A system for measuring radioactivity is described in U.S. Pat. No. 2,643,344, issued on Jun. 23, 1953 to Ian H. McLaren et al. Another systems for measuring radioactivity are described in U.S. Pat. No. 2,648,015 issued on Aug. 4, 1953 to Alexander Greenfield et al., and in U.S. Pat. No. 2,682,000 issued on Jun. 22, 1954 to Joseph F. Clayton et al. Since these three patents are very similar, they are equally authoritative. The system for measuring radioactivity, disclosed in the three patents, includes an analog pointer indicator having three scales, with three associated colored light bulbs, for indicating which scale is applicable for the reading of the measured value. A mechanism for automatic range selection is provided, which is controlled by two solenoids, and which also controls the three associated colored light bulbs. In response to the range selection, one of the light bulbs illuminates the indicator face with a distinctive color to indicate which measurement scale is applicable. After each measurement, the operator must evaluate each measured value to determine its significance, mentally or otherwise.

A digital meter is disclosed in U.S. Pat. No. 2,889,518, issued on Jun. 2, 1959 to Harold R. Hudson et al. The digital meter includes a motor, a wheel counter rotatable by the motor, a potentiometer rotatable by the motor, and a mechanical sampler (vibrator). An unknown voltage is compared, by the sampler, with an instant reference voltage that appears on the wiper of the potentiometer. The motor keeps rotating the potentiometer until the unknown voltage is equal to the reference voltage. The rotation of the motor is then automatically stopped, which also stops the wheel counter, whose position numerically indicates the value of the measured voltage. The decimal point monochromatic lamps are placed between the wheels of the counter. One of the decimal point lamps is illuminated, by manually operated range switch, to indicate by its position the selected measurement range.

The prior art does not contemplate a method of automatically evaluating the measured value. The prior art does not contemplate a method of automatically indicating a significance of the exhibited measured value, by color. The prior art does not contemplate a method of automatically comparing the actual measured value with stored data, representing a measurement limit, to determine their relation.

SUMMARY OF THE INVENTION

Accordingly, it is the principal object of this invention to provide an improved method of indicating a measured value.

It is another object of the invention to provide a method of indicating a measured value on a display device surrounded by a variable color background area.

It is still another object of the invention to provide a method of automatically evaluating the measured value, to determine its significance.

It is still another object of the invention to provide a method of comparing the measured value with a limit, to automatically determine whether the measured value is less than the limit or more than the limit.

It is still another object of the invention to provide a method of comparing the measured value with two limits, to automatically determine whether the measured value lies within the limits or outside the limits.

It is still another object of the invention to provide a method of visually indicating the significance of the measured value.

It is still another object of the invention to provide a method of controlling the color of the background area of the display device on which the measured value is exhibited, to indicate the result of the evaluation of the measured value.

It is still another object of this invention to provide a method of controlling the color of the background area of the display device, to indicate whether the measured value exhibited thereon lies within or without the limits.

It is still another object of the invention to provide a method of simultaneously indicating a measured value, by a digital indication exhibited on a display device, and its relation to a predetermined limit, by color of a background area that surrounds the display device.

In summary, a method of the invention comprises the steps of measuring a signal, providing a digital indication of a measured value on a multicolor light emitting diode display device with an integral variable color background area, comparing the measured value with a limit, and controlling color of the background area in accordance with a relation of the measured value to the limit. Typically, the background area is illuminated in a first color when the measured value is less than the limit, and in a second color when the measured value is greater than the limit.

In the prior art measuring instruments, the measurement is performed by the steps of automatically or manually selecting the proper range, indicating the selected range, either by the color of light shining on the face of an indicator, or by the position of an illuminated decimal point lamp, performing the measurement, and displaying the instant measured value. The operator must then evaluate each measured value, mentally or otherwise, to determine its significance.

In stark contradistinction, in the method of the present invention, each measured value is evaluated automatically, by comparing it with the stored data. The color of the background area is then controlled in accordance with the result of the comparison. As a consequence, the operator does not need to read those measured values that are exhibited in a color consistent with an insignificant measured value (typically within the limits), and can concentrate only on those measured values that are exhibited in a color consistent with a significant measured value (typically outside of the limits).

Accordingly, the invention resides in automatically evaluating the measured value after the measurement, in contradistinction to the prior art, where the measurement range is appraised before the measurement. The invention thus provides a new and unexpected result: the operator does not need to examine those measured values that are indicated, by color, as being insignificant.

Further objects of the invention will become obvious from the accompanying drawings and their description.

BRIEF DESCRIPTION OF THE DRAWINGS

In the drawings in which are shown the preferred embodiments of the invention.

Throughout the drawings, like character indicate like parts.

DESCRIPTION OF THE PREFERRED EMBODIMENTS

Figure 1:
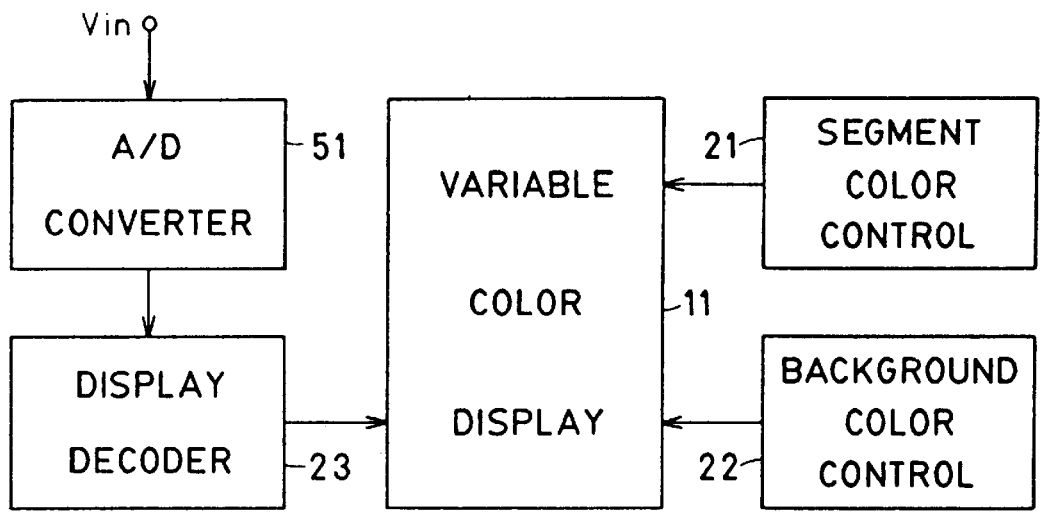
FIG. 1 is a block diagram of a digital voltmeter with a variable color display.

Referring now, more particularly, to the drawings, in FIG. 1 is shown a block diagram of a digital voltmeter utilizing a variable color display surrounded by a variable color background area. The digital voltmeter includes an A/D (analog to digital) converter 51, for converting an analog signal Vin applied to its input to digital data, and a display decoder 23 for causing the digital data to be displayed in a character format on a variable color display 11, in a manner well known to those skilled in the art. As will be more specifically pointed out subsequently, the display 11 includes variable color display areas arranged in a pattern and integral variable color background area. The invention resides in the addition of a segment color control 21 for illuminating the display areas in a suitable color and a background color control 22 for illuminating the background area in a color related to the measured value. The digital voltmeter of this invention can thus simultaneously indicate the measured value, in a character format, and its significance, in a color of the display background. By way of an example, measured value that is considered to be normal may be indicated on green background, measured value that is slightly abnormal may be indicated on blue background, and measured value that is critical may be indicated on red background.

Figure 2:
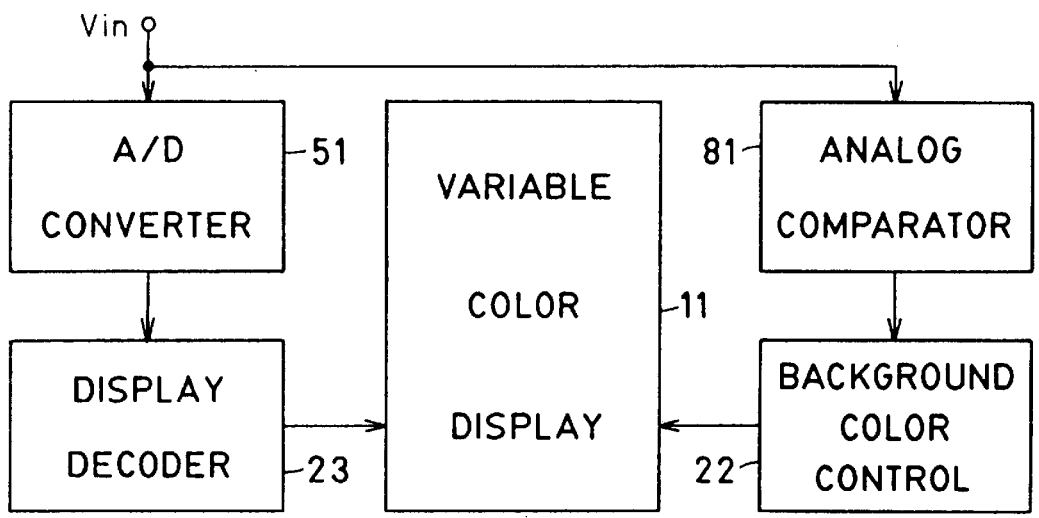
FIG. 2 is a block diagram of a variable color digital voltmeter with an analog comparator.

In FIG. 2 is shown a block diagram of a like digital voltmeter characterized by an analog comparator 81. The input of analog comparator 81 is coupled to the input of A/D converter 51 for comparing the input signal with predetermined limits and for developing comparison signals accordingly. The background color control 22 illuminates the background area of the display in accordance with the comparison signals.

Figure 3:
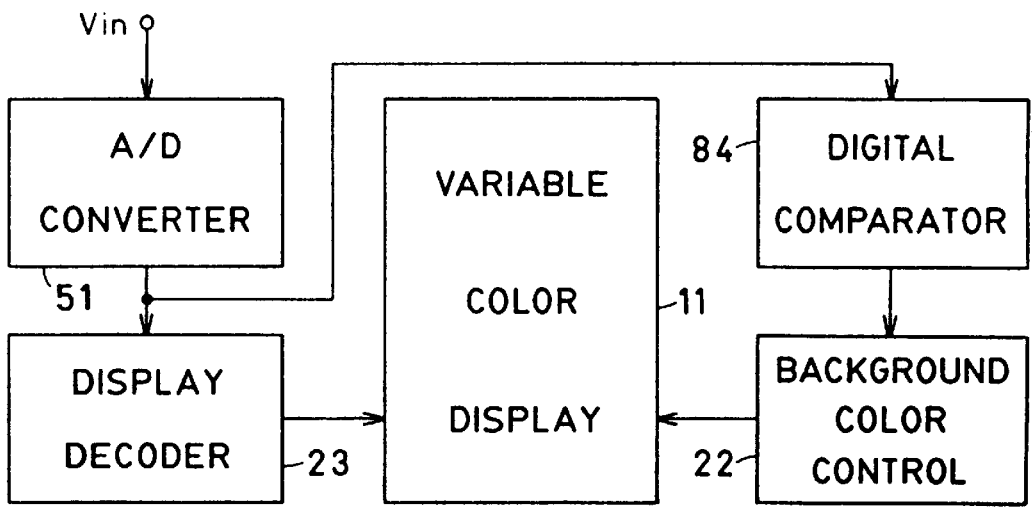
FIG. 3 is a block diagram of a variable color digital voltmeter with a digital comparator.

In FIG. 3 is shown a block diagram of a like digital voltmeter characterized by a digital comparator 84. The input of digital comparator 8 is coupled to the output of A/D converter 51 for comparing the output digital data with predetermined limits and for developing comparison signals accordingly. The background color control 22 illuminates the background area of the display in accordance with the comparison signals.

Figure 4:
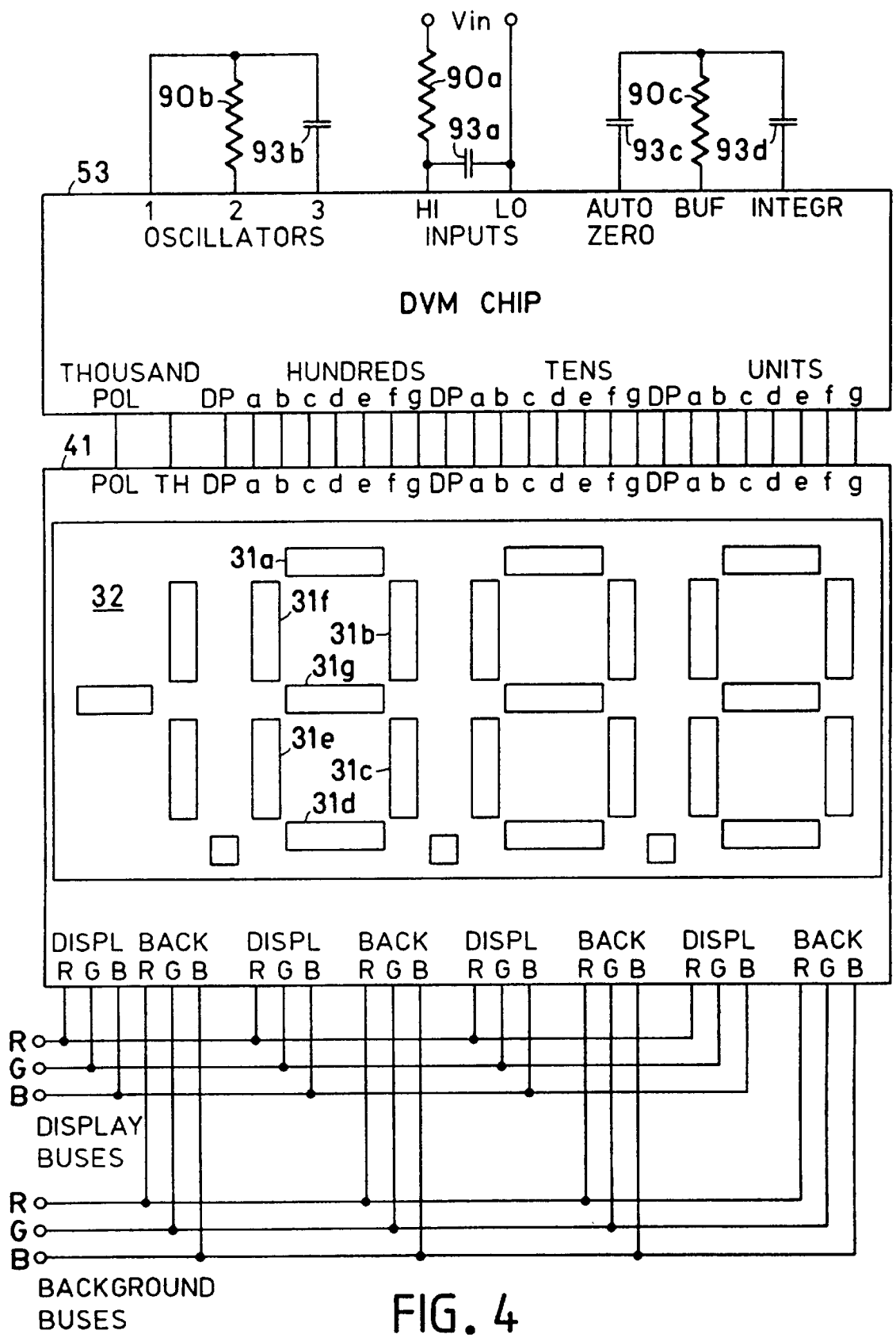
FIG. 4 is a simplified schematic diagram of a digital voltmeter of the invention.

In FIG. 4 is shown a schematic diagram of a digital voltmeter of this invention which includes a DVM (digital voltmeter) chip 53 for measuring input signal Vin applied, via a resistor 90a and decoupling capacitor 93a, to its HI (high) and LO (low) inputs, and for developing segment drive signals a, b, c, d, e, f, g, and DP (decimal point) for a 3½ digit variable color display 41 on which measured values of the input signal may be indicated in a character format. Resistor 90b and capacitor 93b, coupled to input OSCILLATORS, are provided for selecting a suitable frequency of internal oscillators. An auto zero capacitor 93c tends to decrease noise. Integrating capacitor 93d and buffer resistor 90c provide desired voltage swing and linearity.

The first display element of the display 41 consists of a figure '1' and a minus sign. The second, third, and fourth display elements consist of seven segments arranged in a well known 7-segment font on which selected characters may be exhibited in variable color. In the second element, the segments are designated as 31a, 31b, 31c, 31d, 31e, 31f, and 31g. Each display element has three color control inputs R (red), G (green), and B (blue) designated DISPL. Each display element is surrounded by a variable color background area, as will be more clearly pointed out subsequently. The background area of each display element also has three color control inputs R, G, and B designated as BACK. It is obvious from the illustration that the color control inputs of the display elements and background areas are respectively interconnected to form DISPLAY BUSES R, G, and B, for controlling color of all display elements uniformly, and BACKGROUND BUSES R, G, and B, for controlling color of the entire background 32 area uniformly.

Figure 5:
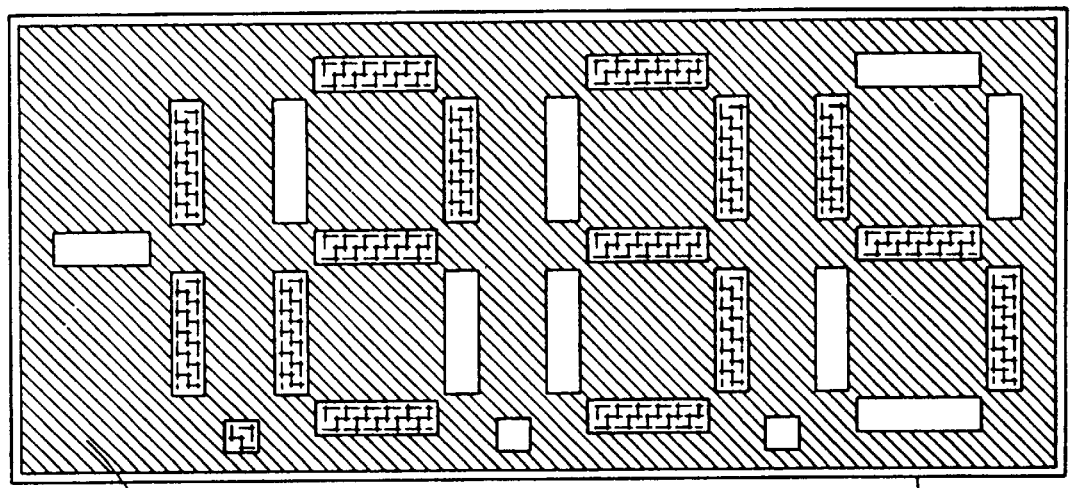
FIG. 5 is an exemplary detail of the display on which measured result is displayed in yellow color on green background.
Figure 6:
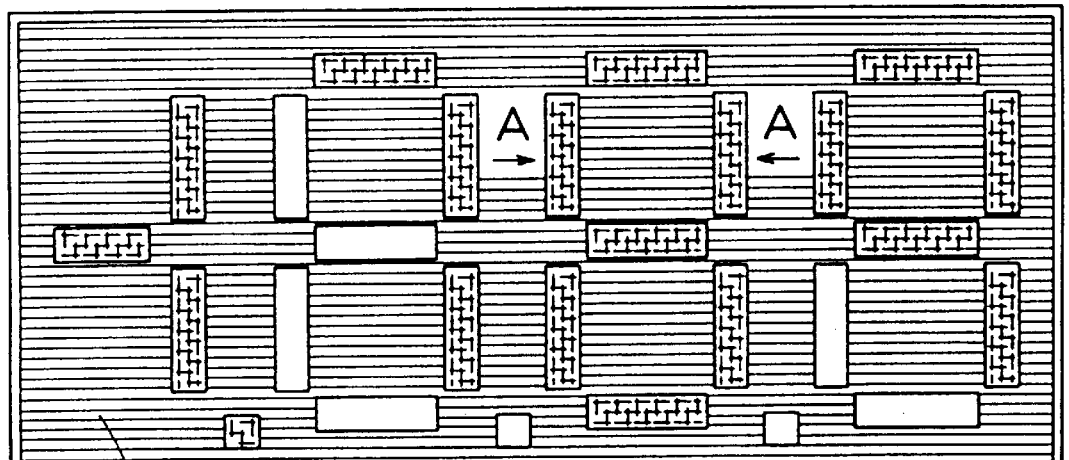
FIG. 6 is a similar detail of the display on which measured result is displayed in yellow color on blue background.
Figure 7:
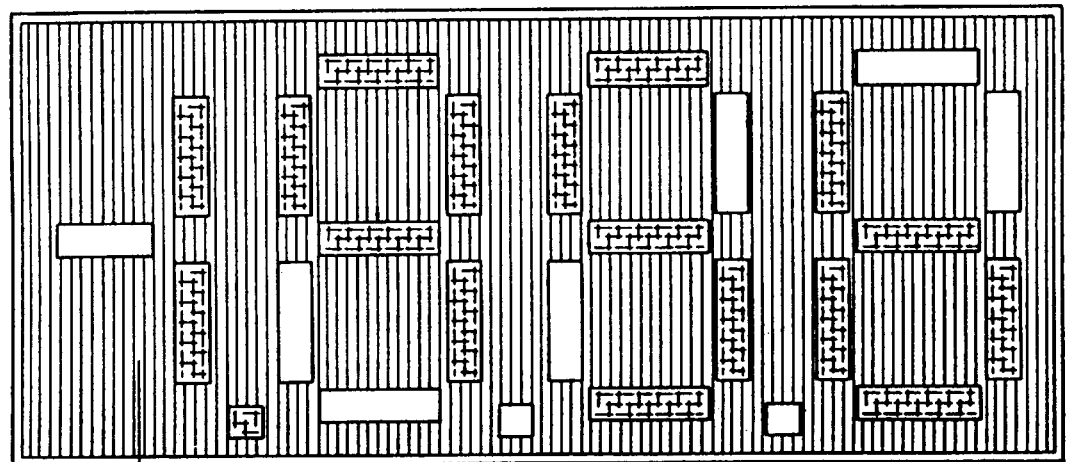
FIG. 7 is a similar detail of the display on which measured result is displayed in yellow color on red background.

FIGS. 5 to 7 are examples of displayed measured values which consider exemplary low limit −1.5 and high limit 1.5 (in Volts or in any other suitable units). The invention resides in controlling the color of background area 32 to indicate whether the measured value lies within the bounds of the low and high limits, below the low limit, or above the high limit. FIG. 5 shows a display on which a measured value 1.234 is displayed on green background, to indicate that it lies within the bounds of the low and high limits. FIG. 6 shows a display on which a measured value −1.789 is displayed on blue background, to indicate that it lies below the low limit. FIG. 7 shows a display on which a measured value 1.956 is displayed on red background, to indicate that it lies above the high limit. To render the illustration less complex, all measured values are displayed in yellow color. It will be appreciated that the color of the display may be also varied, to enhance the presentation, as described in more detail in the above identified copending application.

It is readily apparent that the method of displaying measured values shown in FIGS. 5 to 7 is extremely advantageous. Being completely surrounded by the background area 32, all display elements of the display 41 are distinctly associated therewith. It is perfectly clear that the color of the background area relates only to the values exhibited on the display elements within its boundaries, and not to values exhibited on display elements which may be located outside the boundaries.

Figure 8:
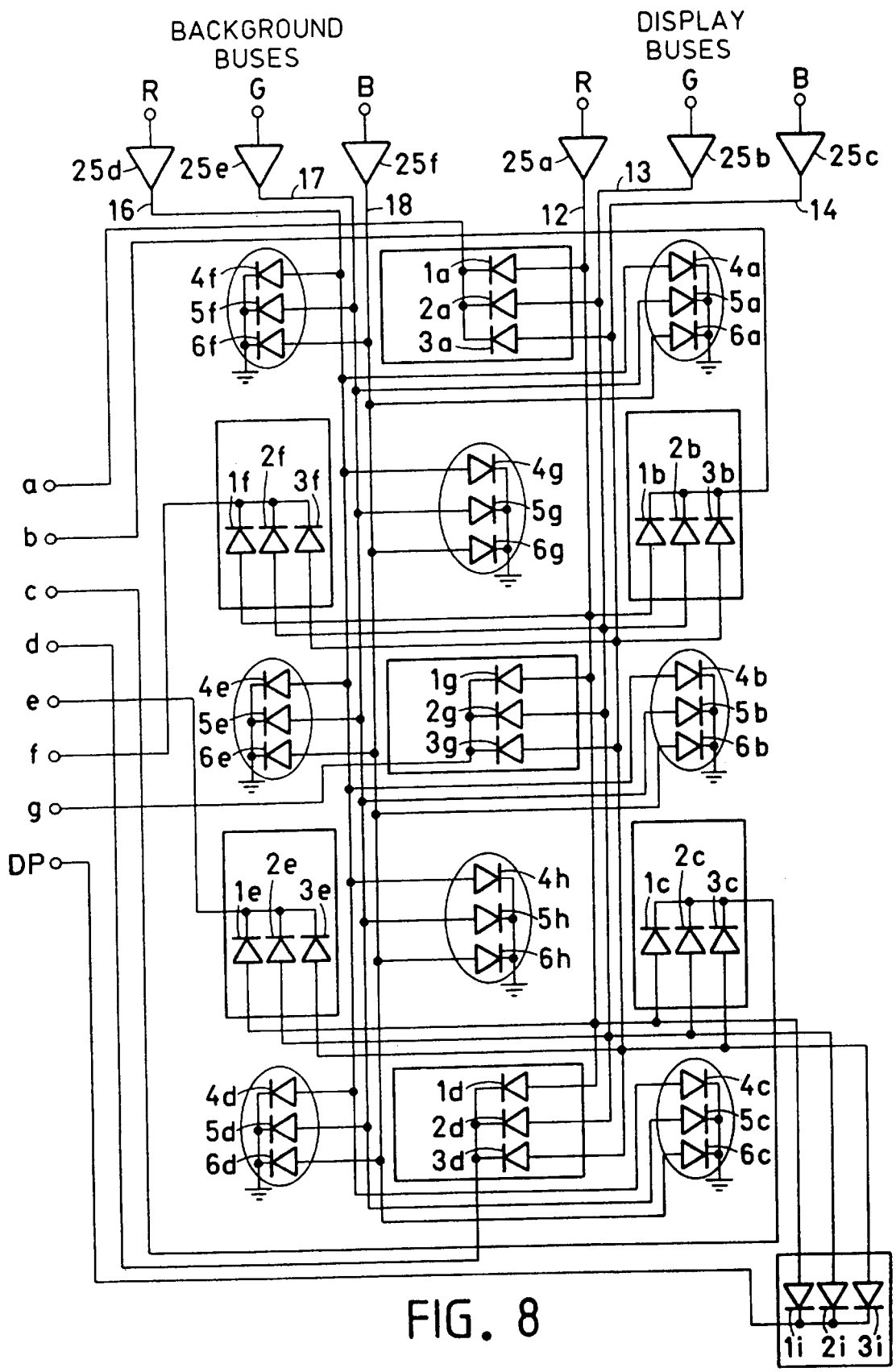
FIG. 8 is a simplified schematic diagram of one element of a variable color display device.

Proceeding now to the detailed description, in FIG. 8 is shown a simplified schematic diagram of a one-character 7-segment variable color display element with variable color background. Each display segment of the display element includes a triad of closely adjacent LEDs: a red LED 1, green LED 2, and blue LED 3 which are adapted for producing a composite light signal of a variable color. To facilitate the illustration, the LEDs are designated by segment letters, e.g., red LED in the segment b is shown at 1b, green LED in the segment d is shown at 2d, and blue LED in the segment f is shown at 3f. The background area is comprised of background regions adjacent the display segments. Each background region includes a triad of closely adjacent LEDs: a red LED 4, green LED 5, and blue LED 6 which are adapted for producing a composite light signal of a variable color. As much as possible, the LEDs in the background regions are designated by letters of adjacent display segments.

The cathodes of all red, green, and blue display LED triads are interconnected in each display segment and electrically connected to respective inputs a, b, c, d, e, f, g, and DP (decimal point) which may be coupled to the outputs of DVM chip 53 viewed in FIG. 4. The anodes of all display red LEDs 1a, 1b, 1c, 1d, 1e, 1f, 1g, and 1i are commonly coupled to an electric path referred to as a display red bus 12. The anodes of all display green LEDs 2a, 2b, 2c, 2d, 2e, 2f, 2g, and 2i are commonly coupled to a like electric path referred to as a display green bus 13. The anodes of all display blue LEDs 3a, 3b, 3c, 3d, 3e, 3f, 3g, and 3i are commonly coupled to a like electric path referred to as a display blue bus 14.

In a similar fashion, the anodes of all background red LEDs 4a, 4b, 4c, 4d, 4e, 4f, 4g, and 4h are commonly coupled to an electric path referred to as a background red bus 16. The anodes of all background green LEDs 5a, 5b, 5c, 5d, 5e, 5f, 5g, and 5h are commonly coupled to a like electric path referred to as a background green bus 17. The anodes of all background blue LEDs 6a, 6b, 6c, 6d, 6e, 6f, 6g, and 6h are commonly coupled to a like electric path referred to as a background blue bus 18. The cathodes of all red, green, and blue LED triads in each background region are grounded.

The display red bus 12 is connected to the output of a non-inverting buffer 25a capable of sourcing sufficient current to illuminate all display red LEDs. The display green bus 13 is connected to the output of a like buffer 25b. The display blue bus 14 is connected to the output of a like buffer 25c. The background red bus 16 is connected to the output of a like buffer 25d. The background green bus 17 is connected to the output of a like buffer 25e. The background blue bus 18 is connected to the output of a like buffer 25f. It would be obvious to those skilled in the art that current limiting resistors may be connected in series with all LEDs in the circuit to constrain current flow.

The operation of the display element shown in FIG. 4 will be now explained on example of illuminating digit '1' in yellow color. To exhibit decimal number '1', low voltage levels are applied to the inputs b and c, to illuminate equally designated segments, and high voltage levels are applied to all remaining inputs, to extinguish all remaining segments.

To illuminate the display element in yellow color, the color control inputs R and G of the display buses are raised to a high logic level, while color control input B is maintained at a low logic level. As a result, the outputs of buffers 25a and 25b rise to a high logic level. The current flows from the output of buffer 25a, via display red bus 12 and red LED 1b, to the input b, and, via red LED 1c, to the input c. The current also flows from the output of buffer 25b, via display green bus 13 and green LED 2b, to the input b, and, via green LED 2c, to the input c. As a result of blending light signals of red and green colors in the segments b and c, the segments illuminate in substantially yellow color, creating a visual impression of a character '1'.

To illuminate the background area in green color, the color control input G of the background buses is raised to a high logic level, while the remaining color control inputs R and B are low. As a result, the output of buffer 25e rises to a high logic level. The current flows therefrom, via background green bus 17 and green LEDs 5a, 5b, 5c, 5d, 5e, 5f, 5g, and 5h in all background regions, to ground. The entire background area illuminates in green color.

To illuminate the background area in blue color, the color control input B of the background buses is raised to a high logic level, while the remaining color control inputs R and G are low. As a result, the output of buffer 25f rises to a high logic level. The current flows therefrom, via background blue bus 18 and blue LEDs 6a, 6b, 6c, 6d, 6e, 6f, 6g, and 6h in all background regions, to ground. The entire background area illuminates in blue color.

To illuminate the background area in red color, the color control input R of the background buses is raised to a high logic level, while the remaining color control inputs G and B are low. As a result, the output of buffer 25d rises to a high logic level. The current flows therefrom, via background red bus 16 and red LEDs 4a, 4b, 4c, 4d, 4e, 4f, 4g, and 4h in all background regions, to ground. The entire background area illuminates in red color.

Figure 9:
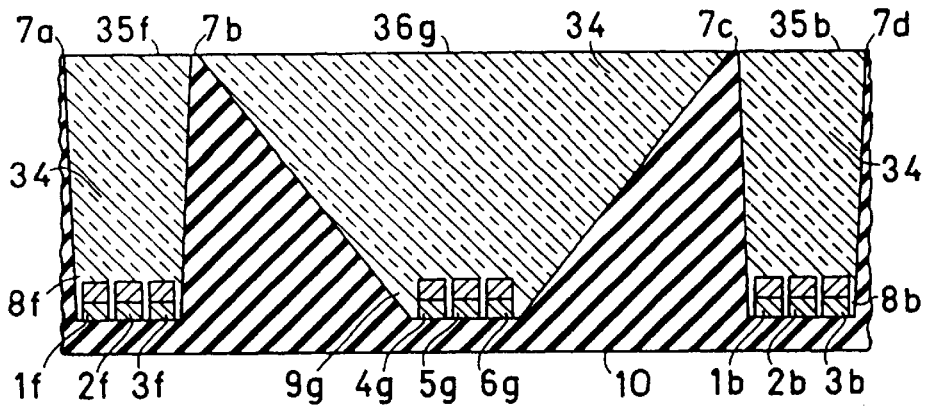
FIG. 9 is a cross-sectional view, taken along the line A—A in FIG. 6, revealing internal structure of a portion of a variable color display device.

An important consideration has been given to physical arrangement of the LEDs in the display areas and background regions, as illustrated in FIG. 9. Display red LED 1f, green LED 2f, and blue LED 3f are disposed on a support 10 in a display light blending cavity 8f and completely surrounded by transparent light scattering material 34. When forwardly biased, the LEDs 1f, 2f, and 3f emit light signals of red, green, and blue colors, respectively, which are blended by passing through light scattering material 34, acting to disperse the light signals, to form a composite light signal that emerges at the upper surface 35f. The color of the composite light signal may be controlled by varying the portions of red, green, and blue light signals. Display red LED 1b, green LED 2b, and blue LED 3b are similarly disposed in a display light blending cavity 8b and may be similarly activated.

In a similar fashion, background red LED 4g, green LED 5g, and blue LED 6g are disposed on the support 10 in a background light blending cavity 9g and surrounded by transparent light scattering material 34. When forwardly biased, the LEDs 4g, 5g, and 6g emit light signals of red, green, and blue colors, respectively, which are blended by passing through the light scattering material 34 to form a composite light signal of a composite color that emerges at the upper surface 36g.

The display light blending cavities are optically separated from adjacent background light blending cavities by opaque walls. The display light blending cavity 8f is defined by walls 7a and 7b. The walls have generally smooth inclined surfaces defining an obtuse angle with the support 10. The walls 7b and 7c similarly define a background light blending cavity 9g therebetween. In a similar fashion, the display light blending cavity 8b is defined by the walls 7c and 7d. The width of the top surfaces of the opaque walls is uniform and distinctly less than the width of the display areas or background regions so as to minimize the boundaries therebetween. The top surfaces of the opaque walls and top surfaces of the display areas and background regions are in the same plane to allow wide angle observation of the display device. Although the walls and light blending cavities are shown to be of certain shapes and dimensions, it is envisioned that they may be modified and rearranged.

Figure 10:
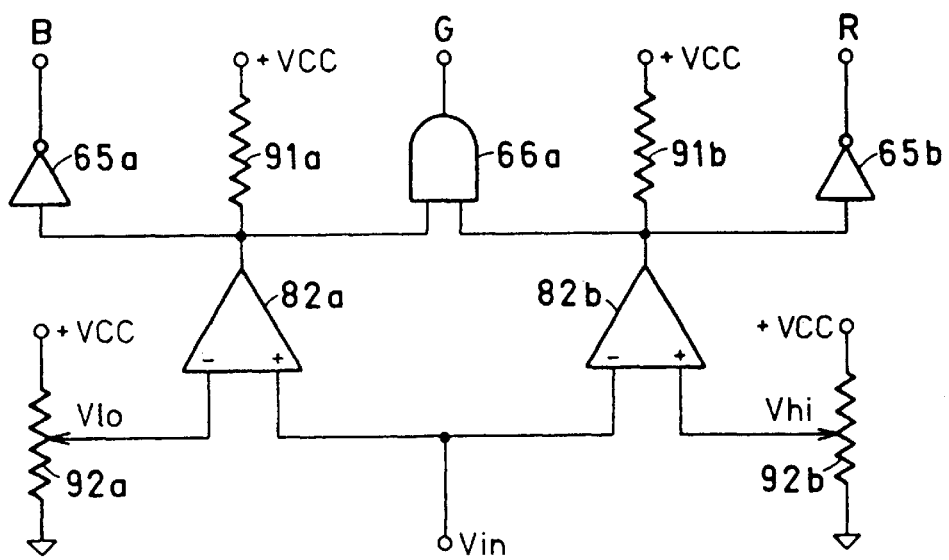
FIG. 10 is a schematic diagram of an analog comparator for developing color control signals.

In FIG. 10, the input signal Vin is applied to the interconnected inputs of two analog comparators 82a, 82b in a classic 'window' comparator configuration. When the input voltage is lower than the low voltage limit Vlo, set by a potentiometer 92a, the output of comparator 82a drops to a low logic level, thereby forcing the output of an inverter 65a to rise to a high logic level to develop active color control signal B.

When the input voltage is higher than the high voltage limit Vhi, set by a potentiometer 92b, the output of comparator 82b drops to a low logic level, thereby forcing the output of an inverter 65b to rise to a high logic level to develop active color control signal R.

When the input voltage is between the low voltage limit Vlo and high voltage limit Vhi, the outputs of comparators 82a, 82b rise to a high logic level (pull-up resistors 91a, 91b ensure correct high and low levels), thereby causing the output of AND gate 66 to rise to a high logic level to develop active color control signal G. The outputs B, G, and R may be respectively coupled to like inputs of the background buses in FIG. 4 to cause the background area 32 to illuminate in one of three colors in accordance with the range in which the measured voltage lies.

Figure 11:
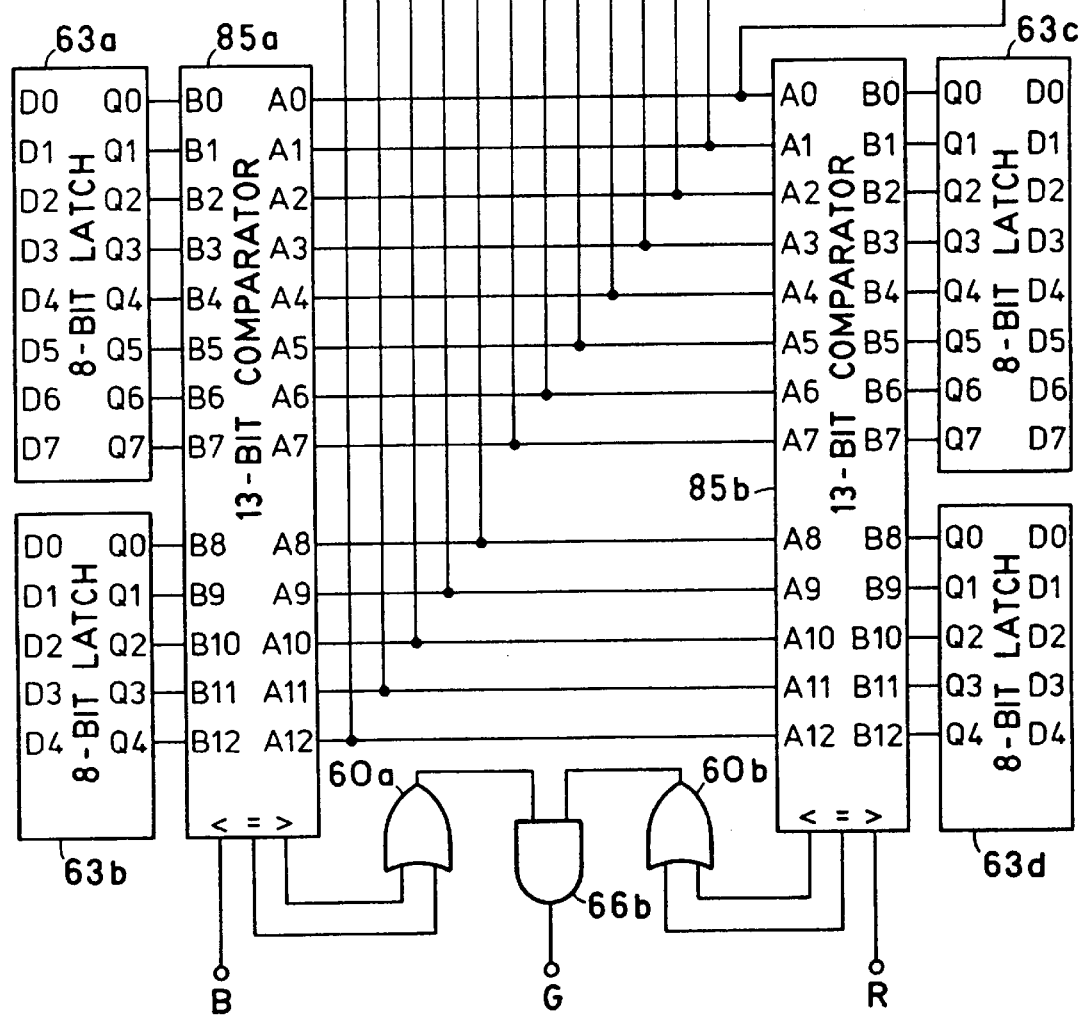
FIG. 11 is a schematic diagram of a digital comparator for developing color control signals.

In FIG. 11 is shown a schematic diagram of a digital voltmeter with a comparator for developing color control signals. A DVM chip 54 measures input signal Vin applied via a resistor 90f to its input IN and develops at its outputs A, B, C, D of Units, Tens, Hundreds, and Thousand digital data corresponding to the value of measured input signal. The input INIT CONV (initiate conversion) is tied to a high logic level for causing the DVM chip to measure continuously. The output digital data are simultaneously applied to the inputs A0 to A12 of a 13-bit digital comparator 85a and to the inputs A0 to A12 of a like comparator 85b. Two 8-bit latches 63a, having its outputs Q0 to Q7 respectively coupled to the inputs B0 to B7 of comparator 85a, and 63b, having its outputs Q0 to Q4 respectively coupled to the inputs B8 to B12 of comparator 85a, are provided for storing a digital representation of a low limit. Two like latches 63c, having its outputs Q0 to Q7 respectively coupled to the inputs B0 to B7 of comparator 85b, and 63d, having its outputs Q0 to Q4 respectively coupled to the inputs B8 to B12 of comparator 85b, are provided for storing a digital representation of a high limit. The comparator 85a effects a comparison of the output digital data with the low limit and develops comparison signals accordingly. The comparator 85b effects a comparison of the output digital data with the high limit and develops comparison signals accordingly. It would be obvious that data in the latches may be readily changed by applying new data to the inputs D0 to D7 and clocking same into the latches (not shown).

When the output digital data of DVM chip 54 are less than the low limit, the output '<' of comparator 85a rises to a high logic level to generate an active color control signal B. When the digital data are greater than the high limit, the output '>' of comparator 85b rises to a high logic level to generate an active color control signal R. When the digital data are within the bounds of the low and high limits, one of the outputs '=' and '>' of comparator 85a, which are gated by an OR gate 60a, and one of the outputs '<' and '=' of comparator 85b, which are gated by an OR gate 60b, rise to a high logic level to force both inputs of an AND gate 66b to rise to a high logic level. As a consequence, the output of OR gate 66b rises to a high logic level to generate active color control signal G. The comparison outputs B, G, and R may be respectively coupled to like inputs of the background buses in FIG. 4 for causing the background area 32 of the display 41 to illuminate either in blue color when the measured value is less than the low limit, in red color when the measured value is greater than the high limit, or in green color when the measured value is within the bounds of the low and high limits. It would be obvious that the color sequences could be readily changed by differently interconnecting the comparison outputs with the background color control inputs.

Figure 12:
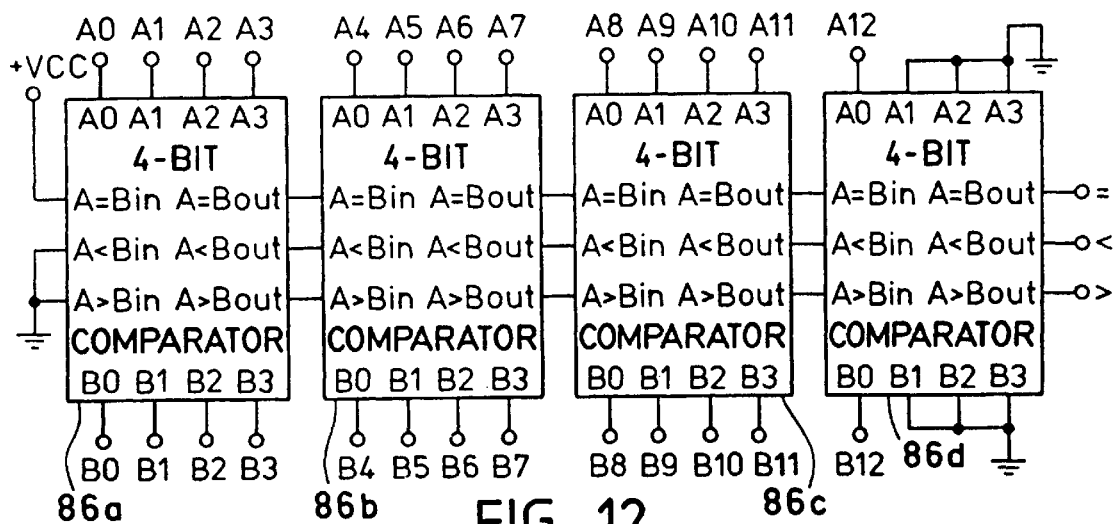
FIG. 12 is a detail of 13-bit digital comparator in FIG. 11.

FIG. 12 is a detail of one of 13-bit digital comparators 85a, 85b in FIG. 11. It will be appreciated that both digital comparators 85a, 85b may be substantially same. The comparison inputs '<', '=', and '>' of four 4-bit digital comparators 86a, 86b, 86c, and 86d are respectively coupled to like preceding outputs, in a manner well understood by those skilled in the art, to extend the comparison range to 13 bits.

The invention may be now briefly summarized. A method of indicating a measured value was disclosed that comprises the steps of measuring a signal, exhibiting a character indication of the measured value on a multicolor light emitting diode display device having an integral variable color background area, comparing the measured value with a limit to determine their relation, and controlling color of the background area accordingly.

The term "variable color background area" should be interpreted broadly as any background area integral with, adjacent to, or associated with, the display device and capable of being illuminated in a selective color.

It would be obvious that persons skilled in the art may resort to modifications in the construction of the preferred embodiments shown herein, without departing from the scope, as defined in the appended claims, and the spirit of the invention. It is contemplated that the principles of the invention may be also applied to numerous diverse types of display devices, such as liquid crystal devices, plasma devices, luminescent devices, cathode ray tube devices, and the like.

CORRELATION TABLE

This is a correlation table of reference characters used in the drawings herein, their descriptions, and examples of commercially available parts.

| # | DESCRIPTION | EXAMPLE |
|---|---|---|
| 1 | display red LED | |
| 2 | display green LED | |
| 3 | display blue LED | |
| 4 | background red LED | |
| 5 | background green LED | |
| 6 | background blue LED | |
| 7 | opaque wall | |
| 8 | display light blending cavity | |
| 9 | background light blending cavity | |
| 10 | support | |
| 11 | variable color display | |
| 12 | display red bus | |
| 13 | display green bus | |
| 14 | display blue bus | |
| 16 | background red bus | |
| 17 | background green bus | |
| 18 | background blue bus | |
| 21 | segment color control | |
| 22 | background color control | |
| 23 | display decoder | |
| 25 | non-inverting buffer | 74LS244 |
| 31 | display segment | |
| 32 | background area | |
| 34 | light scattering material | |
| 35 | top surface of display area | |
| 36 | top surface of background area | |
| 41 | 3 1/2 digit variable color display | |
| 51 | A/D converter | |
| 53 | Teledyne DVM chip | TSC7107 |
| 54 | Teledyne DVM chip | TSC8750 |
| 60 | 2-input OR gate | 74HC32 |
| 63 | 8-bit latch | 74HC373 |
| 65 | inverter | 74HC04 |
| 66 | 2-input AND gate | 74HC08 |
| 81 | analog comparator | |
| 82 | analog comparator chip | LM339 |
| 84 | digital comparator | |
| 85 | 13-bit digital comparator | |
| 86 | 4-bit digital comparator | 74HC85 |
| 90 | resistor | |
| 91 | resistor | |
| 92 | potentiometer | |
| 93 | capacitor | |

What I claim is:

1. A method of indicating a measured value, the method comprising:

measuring a signal for obtaining a measured value of the signal;

exhibiting a digital indication of said measured value on a light emitting diode display device, said display device having a relatively flat display surface substantially surrounded by a variable color light emitting diode background area aligned with said display surface, said background area being capable of illuminating in a selective color in response to a color control signal;

comparing said measured value with stored data;

developing a color control signal in accordance with the relation of said measured value to said data;

applying said color control signal for controlling the color of said background area accordingly.

2. The method as recited in claim 1 wherein:

a. said developing step comprises:

developing a first color control signal when said measured value is less than the value of said data;

developing a second color control signal when said measured value is greater than the value of said data;

b. said applying step comprises:

applying said first color control signal, when said first color control signal is developed, for illuminating said background area in a first color; and applying said second color control signal, when said second color control signal is developed, for illuminating said background area in a second color.

3. The method as recited in claim 1 wherein:

a. said comparing steps comprises:

comparing said measured value with a first limit to determine their relation;

comparing said measured value with a second limit to determine their relation;

the value of said first limit being less than the value of said second limit;

b. said developing step comprises:

developing a first color control signal when said measured value is either less than said first limit or greater than said second limit;

developing a second color control signal when said measured value is simultaneously greater than said first limit and less than said second limit;

c. said applying step comprises:

applying said first color control signal, when said first color control signal is developed, for illuminating said background area in a first color; and applying said second color control signal, when said second color control signal is developed, for illuminating said background area in a second color.

4. The method as recited in claim 1 wherein:

a. said comparing steps comprises:

comparing said measured value with a first limit to determine their relation;

comparing said measured value with a second limit to determine their relation;

the value of said first limit being less than the value of said second limit;

b. said developing step comprises:

developing a first color control signal when said measured value is less than said first limit;

developing a second color control signal when said measured value is simultaneously greater than said first limit and less than said second limit;

developing a third color control signal when said measured value is greater than said second limit;

c. said applying step comprises:

applying said first color control signal, when said first color control signal is developed, for illuminating said background area in a first color;

applying said second color control signal, when said second color control signal is developed, for illuminating said background area in a second color; and applying said third color control signal, when said third color control signal is developed, for illuminating said background area in a third color.

5. A method of automatically evaluating a measured value and of simultaneously indicating the measured value and its evaluation, the method comprising:
measuring a signal for obtaining a measured value of the signal;
exhibiting a digital indication of said measured value on a light emitting diode display device, said display device having a relatively flat display surface substantially surrounded by a variable color light emitting diode background area aligned with said display surface, said background area being capable of illuminating in a selective color in response to a color control signal;
comparing the value of said digital indication with stored data;
developing a color control signal in accordance with the relation of said digital indication to said data;
applying said color control signal to said background area for controlling its color accordingly.

6. A method of automatically evaluating a measured value and of simultaneously indicating the measured value and its evaluation, the method comprising:
measuring a signal for obtaining a measured value of the signal;
exhibiting a digital indication of said measured value on a light emitting diode display device, said display device having a relatively flat display surface substantially surrounded by a variable color light emitting diode background area aligned with said display surface, said background area being capable of illuminating in a selective color in response to a color control signal;
comparing the value of said digital indication with a first limit and with a second limit, the value of said first limit being less than the value of said second limit;
developing a first color control signal when said value of said digital indication is either less than said first limit or greater than said second limit;
developing a second color control signal when said value of said digital indication is simultaneously greater than said first limit and less than said second limit;
applying said first color control signal, when said first color control signal is developed, to said background area for illuminating it in a first color; and
applying said second color control signal, when said second color control signal is developed, to said background area for illuminating it in a second color.

7. A method of automatically evaluating a measured value and of simultaneously indicating the measured value and its evaluation, the method comprising:
measuring a signal for obtaining a measured value of the signal;
exhibiting a digital indication of said measured value on a light emitting diode display device, said display device having a relatively flat display surface substantially surrounded by a variable color light emitting diode background area aligned with said display surface, said background area being capable of illuminating in a selective color in response to a color control signal;
comparing the value of said digital indication with a first limit and with a second limit, the value of said first limit being less than the value of said second limit;
developing a first color control signal when said value of said digital indication is less than said first limit;
developing a second color control signal when said value of said digital indication is simultaneously greater than said first limit and less than said second limit;
developing a third color control signal when said value of said digital indication is greater than said second limit;
applying said first color control signal, when said first color control signal is developed, to said background area for illuminating it in a first color;
applying said second color control signal, when said second color control signal is developed, to said background area for illuminating it in a second color; and
applying said third color control signal, when said third color control signal is developed, to said background area for illuminating it in a third color.

8. A method of automatically evaluating a measured value and of simultaneously indicating the measured value and its evaluation, the method comprising:
measuring a signal for obtaining a measured value of the signal;
exhibiting a digital indication of said measured value on a light emitting diode display device, said display device having a relatively flat display surface substantially surrounded by a variable color light emitting diode background area aligned with said display surface, said background area being capable of illuminating in a selective color in response to a color control signal;
comparing the value of said digital indication with a low limit and with a high limit, and developing a color control signal accordingly;
applying said color control signal to said background area for illuminating it in a first color when said value of said digital indication lies within the bounds of said low limit and said high limit; and
applying said color control signal to said background area for illuminating it in a second color when said value of said digital indication lies outside the bounds of said low limit and said high limit.

9. A method of automatically evaluating a measured value and of simultaneously indicating the measured value and its evaluation, the method comprising:
measuring a signal for obtaining a measured value of the signal;
exhibiting a digital indication of said measured value on a light emitting diode display device, said display device having a relatively flat display surface substantially surrounded by a variable color light emitting diode background area aligned with said display surface, said background area being capable of illuminating in a selective color in response to a color control signal;
comparing the value of said digital indication with a low limit and with a high limit, and developing a color control signal accordingly;
applying said color control signal to said background area for illuminating it in a first color when said value of said digital indication is less than said low limit;
applying said color control signal to said background area for illuminating it in a second color when said value of said digital indication lies within the bounds of said low limit and said high limit; and
applying said color control signal to said background area for illuminating it in a third color when said value of said digital indication is greater than said high limit.

10. A method of automatically evaluating a measured value and of simultaneously indicating the measured value and its evaluation, the method comprising:

measuring a signal for obtaining a measured value of the signal;

exhibiting a digital indication of said measured value on a light emitting diode display device, said display device having a relatively flat display surface substantially surrounded by a variable color light emitting diode background area aligned with said display surface, said background area having a color control input for illuminating it in a selective color;

comparing the value of said digital indication with stored data and developing a comparison output indicative of their relation; and coupling said comparison output to said color control input.

11. A method of automatically evaluating a measured value and of simultaneously indicating the measured value and its evaluation, the method comprising:

measuring a signal for obtaining a measured value of the signal;

exhibiting a digital indication of said measured value on a light emitting diode display device, said display device having a relatively flat display surface substantially surrounded by a variable color light emitting diode background area aligned with said display surface, said background area having two color control inputs for illuminating it in one of two colors;

comparing the value of said digital indication with a low limit and with a high limit and developing two comparison outputs indicative of their relation; and coupling said two comparison outputs to said two color control inputs, respectively.

12. A method of automatically evaluating a measured value and of simultaneously indicating the measured value and its evaluation, the method comprising:

measuring a signal for obtaining a measured value of the signal;

exhibiting a digital indication of said measured value on a light emitting diode display device, said display device having a relatively flat display surface substantially surrounded by a variable color light emitting diode background area aligned with said display surface, said background area having three color control inputs for illuminating it in one of three colors;

comparing the value of said digital indication with a low limit and with a high limit and developing three comparison outputs indicative of their relation; and coupling said three comparison outputs to said three color control inputs, respectively.

* * * * *